United States Patent
Villaret et al.

(10) Patent No.: US 7,709,875 B2
(45) Date of Patent: May 4, 2010

(54) MEMORY CELL COMPRISING ONE MOS TRANSISTOR WITH AN ISOLATED BODY HAVING AN IMPROVED READ SENSITIVITY

(75) Inventors: Alexandre Villaret, Grenoble (FR); Pascale Mazoyer, Domene (FR); Rossella Ranica, Grenoble (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 243 days.

(21) Appl. No.: 11/492,706

(22) Filed: Jul. 25, 2006

(65) Prior Publication Data

US 2007/0023809 A1 Feb. 1, 2007

(30) Foreign Application Priority Data

Jul. 26, 2005 (FR) .................................. 05 52307

(51) Int. Cl.
*H01L 29/94* (2006.01)
(52) U.S. Cl. ...................... 257/296; 257/288; 257/314; 257/E29.061
(58) Field of Classification Search ................ 257/213, 257/288, 296, E29.061; 365/189
See application file for complete search history.

(56) References Cited

U.S. PATENT DOCUMENTS

| | | | |
|---|---|---|---|
| 5,698,869 A | * | 12/1997 | Yoshimi et al. ............. 257/192 |
| 6,213,869 B1 | | 4/2001 | Yu et al. |
| 6,333,217 B1 | | 12/2001 | Umimoto et al. |
| 6,548,842 B1 | * | 4/2003 | Bulucea et al. ............. 257/288 |
| 2002/0034865 A1 | * | 3/2002 | Umimoto et al. ............. 438/514 |
| 2002/0050614 A1 | * | 5/2002 | Unnikrishnan ............. 257/347 |
| 2002/0074612 A1 | * | 6/2002 | Bulucea et al. ............. 257/402 |
| 2004/0089890 A1 | * | 5/2004 | Burnett ....................... 257/296 |
| 2004/0113193 A1 | * | 6/2004 | Menut et al. ................ 257/301 |
| 2004/0166637 A1 | * | 8/2004 | Ito et al. ..................... 438/270 |
| 2006/0067126 A1 | * | 3/2006 | Tang et al. ............. 365/185.18 |

OTHER PUBLICATIONS

French Search Report from French Patent Application 05/52307, filed Jul. 26, 2005.

* cited by examiner

*Primary Examiner*—Lynne A Gurley
*Assistant Examiner*—Vernon P Webb
(74) *Attorney, Agent, or Firm*—Lisa K. Jorgenson; James H. Morris; Wolf, Greenfield & Sacks, P.C.

(57) ABSTRACT

A memory cell with one MOS transistor formed in a floating body region isolated on its lower surface by a junction. A region of the same conductivity type as the floating body region but more heavily doped than said region is arranged under the drain region of the MOS transistor.

10 Claims, 2 Drawing Sheets

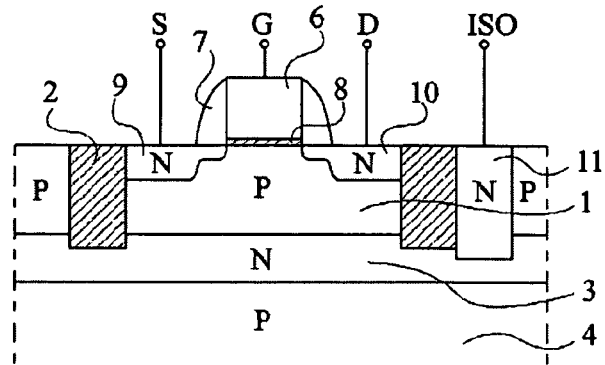
Fig 1
| | $V_{ISO}$ | $V_S$ | $V_D$ | $V_E$ | $I_S(\mu A)$ |
|---|---|---|---|---|---|
| WR1 | 0,4 | 0 | 2 | 1,2 | 20 |
| WR0 | 0,4 | -1,2 | 0 | -1,2 | 0 |
| READ | 0,4 | 0 | 0,4 | 1,2 | 3/16 |
| HOLD | 0,4 | 0 | 0 | 0 | 0 |
| ERASE | 0,4 | -1,2 | 0 | 0 | 0 |
Fig 2
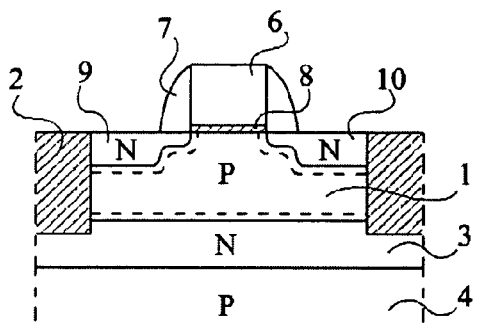
Fig 3A
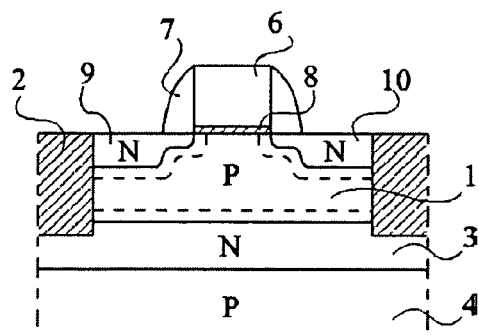
Fig 3B

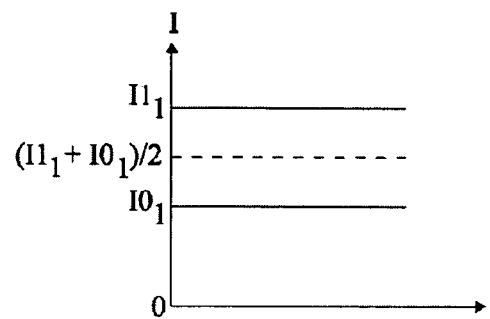
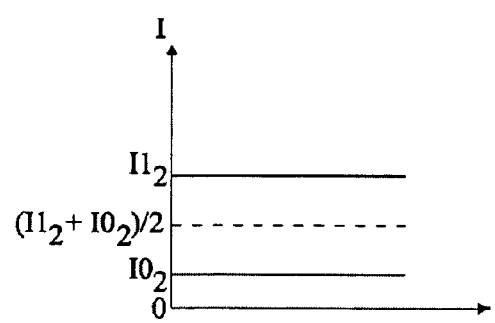
Fig 4A    Fig 4B
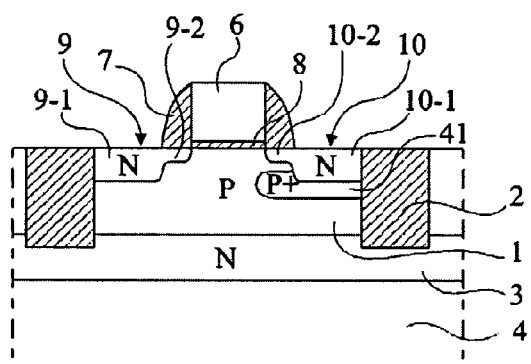
Fig 5
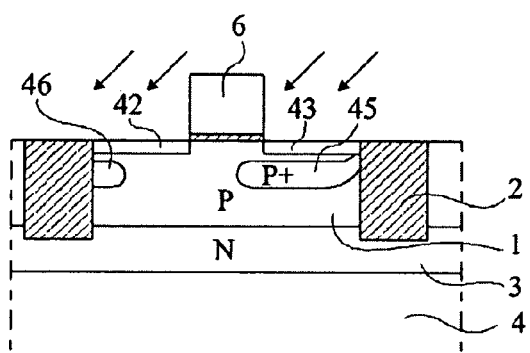
Fig 6

US 7,709,875 B2

MEMORY CELL COMPRISING ONE MOS TRANSISTOR WITH AN ISOLATED BODY HAVING AN IMPROVED READ SENSITIVITY

BACKGROUND OF THE INVENTION

1. Field of the Invention

The present invention generally relates to DRAM-type memory cells with one transistor formed in a floating body or well delimited depthwise by a junction.

2. Discussion of the Related Art

FIG. 1 is a simplified cross-section view of an example of such a memory cell. This cell comprises an N-channel MOS transistor formed in a floating body region 1 laterally delimited by an isolating ring 2 and, depthwise, by an N-type layer 3 formed in a P-type substrate 4. The MOS transistor comprises, on either side of a gate region 6 surrounded with spacers 7 and resting on a gate insulator 8, N-type source and drain regions 9 and 10. Each of the source and drain regions comprises a deeper, more heavily doped region outside of the region defined by spacers 7 and a shallower, less heavily doped region under spacers 7.

In the absence of a specific action on the cell, floating body 1 is at a given voltage corresponding to the thermal equilibrium. It has been shown that positive or negative charges could be injected into this body, setting the cell to one or the other of two determined states which will be designated as 1 and 0. According to this biasing of the substrate, the threshold voltage of the transistor modifies and states 1 and 0 can thus be distinguished.

Further, FIG. 1 shows an N-type conductive well 11 joining buried layer 3 to enable biasing thereof. In the drawing, the biasing terminal is called ISO, and buried layer 3 can be called an insulating layer.

FIG. 2 is a table illustrating the voltages to be applied to the cell in various operation modes thereof. Voltages VISO to be applied to buried layer 3, VS to be applied to the source, VD to be applied to the drain, and VG to be applied to the gate, have more specifically been indicated. In the right-hand column, the conduction current of the transistor measured in these various states, designated as IS and expressed in microamperes while all the voltages are expressed in volts, has been indicated. More specifically, states of writing of a 1 (WR1), of writing of a 0 (WR0), of reading (READ), of holding or retaining (HOLD), and of erasing (ERASE) have been distinguished. The values given in this table are given as an example only and correspond to a specific technology. The relative values of the various voltages and their biasings should essentially be considered. The given example corresponds to a technology in which the minimum possible dimension of a pattern is on the order of 0.12 μm, and in which a gate length on the order of 0.30 μm and a depth of STI insulation regions 2 on the order of 0.35 μm, as well as a gate oxide thickness on the order of 6 nm, have been selected.

Thus, the main states of the cell are the following.

Writing of a 1 (WR1). The MOS transistor is set to a relatively high conduction state (currents on the order of 20 μA). This state can be established for a very short time only, for example, on the order of a few nanoseconds. At the end of this state, when all the applied voltages are brought back to zero, except the buried layer voltage which is preferably maintained at a slightly positive value, for example, 0.4 volt, the memory cell is in the state illustrated in FIG. 3A, that is, positive charges have been stored in the floating body. Once the memory cell is at the thermal equilibrium state, the charges tend, as illustrated, to narrow the space charge areas. The transistor then has a low threshold voltage, that is, in a read state in which the transistor is lightly biased to be conductive, a first current (16 μA in the illustrated example) will be observed for a given gate voltage.

Writing of a 0 (WR0). The transistor is off, its gate being set to a negative voltage, and its source (or its drain) is also set to a negative voltage, whereby the positive charges possibly present in the substrate are eliminated and negative charges are injected after the setting to the conductive state of the body-source or body-drain diode. At the end of this state, as illustrated in FIG. 3B, the space charge areas tend to widen, which results in an increase in the transistor threshold voltage. Thus, in read conditions in which the transistor is lightly biased to the conductive state, a current lower than the current at state 1 (3 μA instead of 16 μA in the illustrated example) is obtained for a same 1.2-V gate voltage as that considered in the previous case.

Reading (READ). The MOS transistor is set to a slightly conductive state, the drain for example only being at a voltage on the order of 0.4 V to limit injections capable of deprogramming the transistor. The current flowing through transistor MOS is measured or, preferably, compared with a reference value ranging between the current values corresponding to states 1 and 0.

Holding (HOLD). No voltage is applied to the transistor. The voltage applied to buried layer 3 is preferably maintained slightly positive to better block the junction between the isolated body and the buried layer in the case where the transistor is programmed at state 1.

Erasing (ERASE). The source/body (or drain/body) junction is biased in the conductive state, which enables evacuating positive charges. Buried layer 3 remains slightly positively biased.

Thus, as discussed previously, the memory effect of a cell according to the present invention is characterized by a difference between a current at state 1 and a current at state 0 for a given drain-source biasing and for a given gate voltage.

Generally, during the read phase, the detected current corresponding to a state 1 (I1) or to a state 0 (I0) is compared with a reference current $I_{ref}$. Reference current $I_{ref}$ is generally selected to be equal to average (I1+I0)/2 of I1 and I0. However, given that there is a dispersion from one cell to another on the values of I1 and I0 according to the technology and that, further, values I0 and I1 are likely to vary, especially according to the cell use duration, the reading risks being tainted with error.

SUMMARY OF THE INVENTION

An object of the present invention is to improve the read sensitivity.

To achieve this and other objects, the present invention provides a memory cell with a MOS transistor formed in a floating body region isolated on its lower surface by a junction, in which a region of the same conductivity type as the floating body region but more heavily doped than said region is arranged under the drain region of the MOS transistor.

According to an embodiment of the present invention, the drain region comprises a drain contact region and a more lightly doped drain extension region on the gate side, and the region of the same conductivity type as the floating body region extends under the drain contact region, adjacently thereto.

According to an embodiment of the present invention, the floating body region has a doping level on the order of $10^{17}$ at./cm$^3$, and the region of the same conductivity type as the floating body region is a buried region having an average doping on the order of from $5.10^{17}$ to $10^{19}$ at./cm³.

The present invention also provides a method for manufacturing a cell such as mentioned hereabove in which said region of the same conductivity type as the floating body region results from an oblique implantation performed after forming of the MOS transistor gate, the orientation of the wafer with respect to the implantation direction being selected so that the gate substantially masks the implantation on the source side.

The present invention also aims at an integrated circuit comprising at least a memory cell such as mentioned hereabove.

The foregoing and other objects, features, and advantages, of the present invention will be discussed in detail in the following non-limiting description of specific embodiments in connection with the accompanying drawings.

BRIEF DESCRIPTION OF THE DRAWINGS

FIG. 1 shows a memory cell comprising a transistor with a floating body;

FIG. 2 is a table illustrating examples of voltages applied to the cell of FIG. 1 in different states;

FIG. 3A shows the structure of FIG. 1 in the hold state after writing of a state 1;

FIG. 3B shows the structure of FIG. 1 in the hold state after writing of a state 0;

FIGS. 4A and 4B show two different sets of currents at state 1 and at state 0;

FIG. 5 is a simplified cross-section view of a memory cell according to an embodiment of the present invention; and FIG. 6 is an example of a manufacturing step of the memory cell according to the present invention.

DETAILED DESCRIPTION

As usual in the representation of integrated circuits, the various cross-section views are not drawn to scale.

Statistic studies performed on cell models show that the read error risk (confusion of a 1 and of a 0 or non-detection of a 1 or of a 0) decreases, for a given difference I1−I0, along with the average value of I1+I0, that is, along with the value of $I_{ref}$. Thus, the risk of a read error is smaller in the case of FIG. 4B than in the case of FIG. 4A.

The inventors have thus formed a memory cell comprising a transistor with a floating body region in which interval I1−I0 is substantially unmodified with respect to a conventional cell such as that shown in FIG. 1 but in which the values of I1 and I0 are smaller.

The inventors have shown that this result is obtained when the doping of floating body region 1 under the drain region is increased. Thus, the inventors provide, as shown in FIG. 5, forming under drain region 10 a P-type region 41 more heavily-doped than the rest of the floating region. Experience has shown that this would provide satisfactory results, the read currents at state 0 and at state 1 being both decreased by a few microamperes. An explanation of this result is that, due to the heavier doping of the P-type region under the drain, the space charge area (not shown) extends more into the N-type drain region. As a result, the effective channel width between source and drain increases and thus, for a given gate voltage, the read current decreases.

It should further be noted that the representation of more heavily-doped region 41 is purely for illustration purposes, the extent of this area and its rise to the drain extension region depending on the implantation and anneal conditions.

Same reference numerals as in FIG. 4 have been used in FIG. 5. However, in source region 9, a source contact region 9-1 and a source extension region 9-2, more lightly doped, have been distinguished under spacer 7. Similarly, a drain contact region 10-1 and a more lightly-doped drain extension region 10-2 under spacer 7 have been distinguished under drain region 10. Region 41 is preferably located under drain contact region 10-1 and is adjacent thereto, without rising back up in the channel region under gate 6.

It will be within the abilities of those skilled in the art to manufacture a structure of the type in FIG. 5. For example, region 41 could be formed after forming of the gate and before (or after) forming of the spacers by masking half of the structure with a mask stopping on the gate and by performing an implantation of P-type dopant ions, for example, boron. In the case where floating body region 1 has a doping level on the order of $10^{17}$ at./cm³, region 41 will be a buried region having an average doping on the order of from $5.10^{17}$ to $10^{19}$ at./cm³.

Another method for forming region 41 is illustrated in FIG. 6. It is started from a P-type substrate 4 in which an active region has been defined with shallow trenches 2 filled with an insulator. A step at which gate 6 has been formed on its gate insulator 8 and where regions 42 and 43 which will correspond to the source and drain extension regions have been formed is considered. An oblique implantation of boron atoms with an implantation power selected so that the implanted region is clearly located under regions 42 and 43 is then performed. On the drain side, a region 45 which widely extends around the drain, and which will remain around the drain even once the more heavily-doped drain regions will be implanted after forming of the spacers, is obtained. On the source side, the oblique implantation is for the most part masked by gate 6. A small area designated with reference numeral 46 will optionally be implanted to the left on the drawing. However, this implantation is all the less disturbing as it will be partially erased by the heavy-dose N-type implantation performed afterwards to form the source contact region.

The present invention is likely to have various alterations, modifications, and improvements which will occur to those skilled in the art. In particular, the various materials used and the indicated dimensions may be modified according to the technology which is used, provided that the described functions are achieved.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory cell having one MOS transistor, the one MOS transistor comprising:
   a drain region having a first surface;
   a floating body region in which the one MOS transistor is formed, the floating body region having a first conductivity type and a lower surface, the floating body region being isolated on the lower surface by a PN junction;
   a second region having the first conductivity type and being more heavily doped than the floating body region, the second region being arranged under the drain region and extending along at least all of the first surface of the drain region;
   wherein the drain region comprises a drain contact region and a more lightly doped drain extension region on a gate side, and wherein the second region extends under the drain contact region, adjacently thereto.

2. The memory cell of claim 1, wherein the floating body region has a doping level on an order of $10^{17}$ at./cm³, and the second region is a buried region having an average doping on the order of from $5.10^{17}$ to $10^{19}$ at./cm³.

3. A method for manufacturing a memory cell having one MOS transistor, the one MOS transistor comprising:
   a drain region having a first surface;
   a floating body region in which the one MOS transistor is formed, the floating body region having a first conductivity type and a lower surface, the floating body region being isolated on the lower surface by a junction; and
   a second region having the first conductivity type and being more heavily doped than the floating body region, the second region being arranged under the drain region, wherein the second region results from an oblique implantation performed after forming of a MOS transistor gate, an orientation of a wafer with respect to a direction of the implantation being selected so that the gate substantially masks the implantation on a source side.

4. An integrated circuit comprising at least one memory cell of claim 1.

5. A memory cell, comprising:
   a MOS transistor formed in a floating body region, the floating body region being isolated on a lower surface by a PN junction, the MOS transistor comprising a second region formed in the floating body region, the second region configured to increase an effective channel width of the transistor so as to reduce a first read current of the transistor corresponding to a logic 1 state and reduce a second read current of the transistor corresponding to a logic 0 state while maintaining a difference between the first read current and the second read current.

6. The memory cell of claim 5, wherein the MOS transistor includes a drain region, and wherein the second region is disposed under the drain region.

7. The memory cell of claim 6, wherein the second region extend along all of a first surface of the drain region.

8. The memory cell of claim 5, wherein the floating body region and the second region have a same conductivity type.

9. The memory cell of claim 8, wherein the second region is more heavily doped than the floating body region.

10. The memory cell of claim 5, further comprising an isolating ring laterally delimiting the floating body region.

\* \* \* \* \*

UNITED STATES PATENT AND TRADEMARK OFFICE
CERTIFICATE OF CORRECTION

| | | |
|---|---|---|
| PATENT NO. | : 7,709,875 B2 | Page 1 of 1 |
| APPLICATION NO. | : 11/492706 | |
| DATED | : May 4, 2010 | |
| INVENTOR(S) | : Alexandre Villaret et al. | |

It is certified that error appears in the above-identified patent and that said Letters Patent is hereby corrected as shown below:

On the Title Page, Item (73) should read:
(73) Assignee: STMicroelectronics (Crolles 2) SAS, Crolles, (FR)

Signed and Sealed this
Tenth Day of April, 2012

David J. Kappos
*Director of the United States Patent and Trademark Office*